12) United States Patent
Nonaka et al.

(10) Patent No.: US 10,867,791 B2
(45) Date of Patent: Dec. 15, 2020

(54) METHOD FOR MANUFACTURING EPITAXIAL SILICON WAFER AND EPITAXIAL SILICON WAFER

(71) Applicant: SUMCO CORPORATION, Tokyo (JP)

(72) Inventors: Naoya Nonaka, Tokyo (JP); Tadashi Kawashima, Tokyo (JP); Kenichi Mizogami, Nagasaki (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/497,869

(22) PCT Filed: Mar. 28, 2018

(86) PCT No.: PCT/JP2018/012640
§ 371 (c)(1),
(2) Date: Sep. 26, 2019

(87) PCT Pub. No.: WO2018/186248
PCT Pub. Date: Oct. 11, 2018

(65) Prior Publication Data
US 2020/0027727 A1    Jan. 23, 2020

(30) Foreign Application Priority Data

Apr. 6, 2017 (JP) .................... 2017-076034

(51) Int. Cl.
H01L 21/02    (2006.01)
C23C 16/24    (2006.01)
(Continued)

(52) U.S. Cl.
CPC ........ H01L 21/02381 (2013.01); C23C 16/24 (2013.01); C30B 25/20 (2013.01); C30B 29/06 (2013.01)

(58) Field of Classification Search
CPC ........ H01L 21/02381; H01L 21/02433; H01L 21/02532; H01L 21/02658; H01L 21/30
See application file for complete search history.

(56) References Cited

U.S. PATENT DOCUMENTS 6,626,994 B1 * 9/2003 Kimura ................ C30B 15/203
117/84
9,850,595 B2 * 12/2017 Hoshi ..................... C30B 29/06
(Continued)

FOREIGN PATENT DOCUMENTS

JP    2004-091234 A    3/2004
JP    2014-011293 A    1/2014
WO    2016/174997    11/2016

OTHER PUBLICATIONS

International Search Report issued in International Patent Application No. PCT/JP2018/012640, dated Jun. 19, 2018; and English-language translation thereof.

(Continued)

Primary Examiner — Jaehwan Oh
(74) Attorney, Agent, or Firm — Greenblum & Bernstein, P.L.C.

(57) ABSTRACT

A manufacturing method of an epitaxial silicon wafer uses a silicon wafer containing phosphorus, having a resistivity of less than 1.0 mΩ·cm. The silicon wafer has a main surface to which a (100) plane is inclined and a [100] axis that is perpendicular to the (100) plane and inclined at an angle ranging from 0°5' to 0°25' with respect to an axis orthogonal to the main surface. The manufacturing method includes: annealing the silicon wafer at a temperature from 1200 degrees C. to 1220 degrees C. for 30 minutes or more under argon gas atmosphere (argon-annealing step); etching a surface of the silicon wafer (prebaking step); and growing the epitaxial film at a growth temperature ranging from 1100
(Continued)

degrees C. to 1165 degrees C. on the surface of the silicon wafer (epitaxial film growth step).

3 Claims, 7 Drawing Sheets

(51) Int. Cl.
 *C30B 25/20* (2006.01)
 *C30B 29/06* (2006.01)

(56) References Cited

U.S. PATENT DOCUMENTS

| | | |
|---|---|---|
| 2005/0035349 A1 | 2/2005 | Umeno et al. |
| 2006/0131553 A1* | 6/2006 | Yamanaka ........ H01L 21/02027 257/1 |
| 2018/0087184 A1 | 3/2018 | Nonaka et al. |

OTHER PUBLICATIONS

International Preliminary Report on Patentability (IPRP) and Written Opinion for International Patent Application No. PCT/JP2018/012640, dated Oct. 8, 2019; and English-language translation thereof.

* cited by examiner

METHOD FOR MANUFACTURING EPITAXIAL SILICON WAFER AND EPITAXIAL SILICON WAFER

TECHNICAL FIELD

The present invention relates to a manufacturing method of an epitaxial silicon wafer and an epitaxial silicon wafer.

BACKGROUND ART

For instance, a very low substrate resistivity is required for an epitaxial silicon wafer used for a power MOS transistor. In order to obtain a sufficiently low substrate resistivity of a silicon wafer, when a single crystal ingot (a material of a silicon wafer) is pulled up (i.e., during growth of silicon crystals), a silicon melt is doped at a high concentration with an n-type dopant (phosphorus (P)) for adjusting a resistivity. Such a silicon wafer having a very low substrate resistivity has been used (for instance, see Patent Literature 1).

Patent Literature 1 discloses that, when an epitaxial film is grown on a silicon wafer that is added with phosphorus during growth of single crystal silicon so as to have a resistivity of 0.9 mΩ·cm or less, a lot of stacking faults (hereinafter, abbreviated as SF) are generated on the epitaxial film and appear in a form of steps on a surface of the silicon wafer to significantly deteriorate Light Point Defect (LPD) on the surface of the silicon wafer.

In order to eliminate such disadvantages, Patent Literature 1 discloses that the silicon wafer before an epitaxial film is grown thereon is annealed under argon gas atmosphere, and subsequently the epitaxial film is grown on the silicon wafer.

CITATION LIST

Patent Literature(S)

Patent Literature 1 JP 2014-11293 A

SUMMARY OF THE INVENTION

Problem(s) to be Solved by the Invention

However, when the epitaxial silicon wafer manufactured according to the method disclosed in Patent Literature 1 is used for a semiconductor device, electrical characteristics of the semiconductor device are sometimes insufficient.

An object of the invention is to provide a manufacturing method of an epitaxial silicon wafer capable of manufacturing a semiconductor device having sufficient electrical characteristics, and the epitaxial silicon wafer.

Means for Solving the Problem(s)

As a result of a dedicated study, the inventors have reached findings as follows.

An epitaxial film of the epitaxial silicon wafer manufactured according to the method of Patent Literature 1, where no SF was detected by a surface inspector, was subjected to selective etching with an M-Dash liquid ((hydrofluoric acid (50 wt %):nitric acid (70 wt %):acetic acid (100 wt %):$H_2O$=1:3:8 to 12:0.17)+an aqueous solution of silver nitrate (0.005 to 0.05 g/L))(see SEMI MF1809-0704). When a surface of the epitaxial film after being subjected to the selective etching was observed using a Transmission Electron Microscope (TEM), dislocation defects DF (dislocation lines described later) were present as shown in FIG. 1A. Further, when a vertical cross section of the epitaxial film taken along an A-A line in FIG. 1A was observed with the TEM, the dislocation defect DF extended diagonally to the surface of the epitaxial film EP as shown in FIG. 1B.

The dislocation defect DF had a size of about 1 μm to 2 μm in a plan view, had a main surface to which a (100) plane was inclined, and was in a form of a dislocation line having a crystal orientation in any direction of a [011] direction, [0-1-1] direction, [0-11] direction and [01-1] direction.

Since the above-described dislocation defect DF cannot be detected before the selective etching, it is considered that, on the epitaxial film that has not been subjected to the selective etching, the dislocation defect DF is present in a form of a dislocation line having a certain crystal orientation and an end close to the surface of the epitaxial film EP being located inside the epitaxial film EP (i.e., the entire dislocation line is located within the epitaxial film).

Moreover, it is presumable that the dislocation line is generated by micropits of the silicon wafer caused by clusters of oxygen and phosphorus in the same manner as SF.

Based on the above results, the inventors estimated that the dislocation line not appearing on the surface of the epitaxial film EP would deteriorate electrical characteristics of a semiconductor device, and found that formation of an epitaxial film on a silicon wafer having a predetermined plane orientation reduced the generation of the dislocation line having a plane orientation, thereby achieving the invention.

According to an aspect of the invention, a manufacturing method of an epitaxial silicon wafer, in which the epitaxial silicon wafer includes: a silicon wafer doped with phosphorus as a dopant and having a resistivity of less than 1.0 mΩ·cm; and an epitaxial film formed on the silicon wafer, includes: preparing the silicon wafer comprising a main surface to which a (100) plane is inclined and a [100] axis that is perpendicular to the (100) plane and inclined at an angle ranging from 0°5' to 0°25' with respect to an axis orthogonal to the main surface; annealing the silicon wafer at a temperature from 1200 degrees C. to 1220 degrees C. for 30 minutes or more under argon gas atmosphere; prebaking to etch a surface of the silicon wafer after the annealing; and growing the epitaxial film at a growth temperature ranging from 1100 degrees C. to 1165 degrees C. on the surface of the silicon wafer after the prebaking.

According to the above aspect of the invention, the silicon wafer where the dislocation line is unlikely to be generated is prepared by decreasing an inclination angle of a crystal axis of the silicon wafer to reduce the number of Step on a dislocation surface (i.e., a slip plane (111)) appearing on the (100) plane. The silicon wafer is heated under argon gas atmosphere, thereby dissolving micropits caused by clusters of oxygen and phosphorus into solution. After the silicon wafer is annealed under argon gas atmosphere, the surface of the silicon wafer is etched (prebaked), thereby removing micropits to reduce the dislocation line from generating from the micropits during the epitaxial film growth. When the epitaxial film is grown at a low temperature on the silicon wafer having a small inclination angle of the crystal axis, hillock defects are likely to be generated. In order to reduce the generation of the hillock defects, the epitaxial film is preferably grown at a high temperature.

Consequently, the epitaxial silicon wafer, which has the dislocation line at a density equal to or less than 10 pieces per square centimeter to show the reduced generation of the dislocation line, can be obtained. The thus prepared epitaxial silicon wafer is usable for manufacturing a semiconductor device having sufficient electrical characteristics.

In the manufacturing method of the epitaxial silicon wafer according to the above aspect of the invention, the surface of the silicon wafer is preferably etched at a removal dimension ranging from 150 nm to 600 nm in the prebaking.

With this arrangement, micropits caused by clusters, which are unable to be dissolved into solution by being heated under argon gas atmosphere, can be removed by the etching (prebaking), so that the generation of the the dislocation line can be reduced.

According to another aspect of the invention, an epitaxial silicon wafer includes: a silicon wafer doped with phosphorus as a dopant and having a resistivity of less than 1.0 mΩ·cm; and an epitaxial film formed on the silicon wafer, in which the silicon wafer includes a main surface to which a (100) plane is inclined and a [100] axis that is perpendicular to the (100) plane and inclined at an angle ranging from 0°5' to 0°25' with respect to an axis orthogonal to the main surface, in which a density of a dislocation line having a crystal orientation and entirely located inside the epitaxial film is equal to or less than 10 pieces per square centimeter.

The above aspects of the invention are preferably applied to a silicon wafer doped with phosphorus as a dopant and having a resistivity of less than 0.9 mΩ·cm, further preferably less than 0.8 mΩ·cm.

BRIEF DESCRIPTION OF DRAWING(S)

DESCRIPTION OF EMBODIMENT(S)

Exemplary Embodiment(s)

An exemplary embodiment of the invention will be described below with reference to the attached drawings.

Arrangement of Epitaxial Silicon Wafer

Figure 2A:
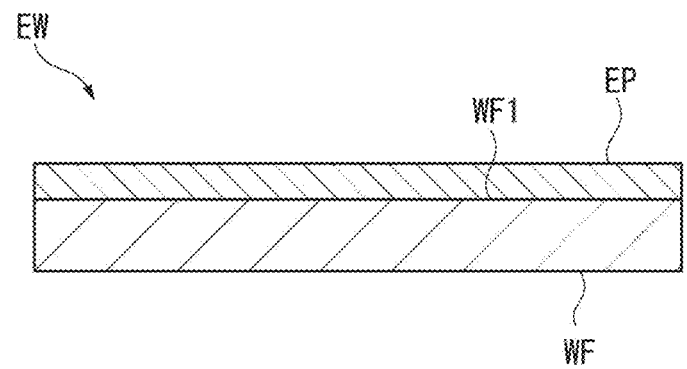
FIG. 2A is a cross-sectional view showing an epitaxial silicon wafer according to an exemplary embodiment of the invention.

As shown in FIG. 2A, an epitaxial silicon wafer EW includes a silicon wafer WF and an epitaxial film EP formed on the silicon wafer WF.

Figure 2B:
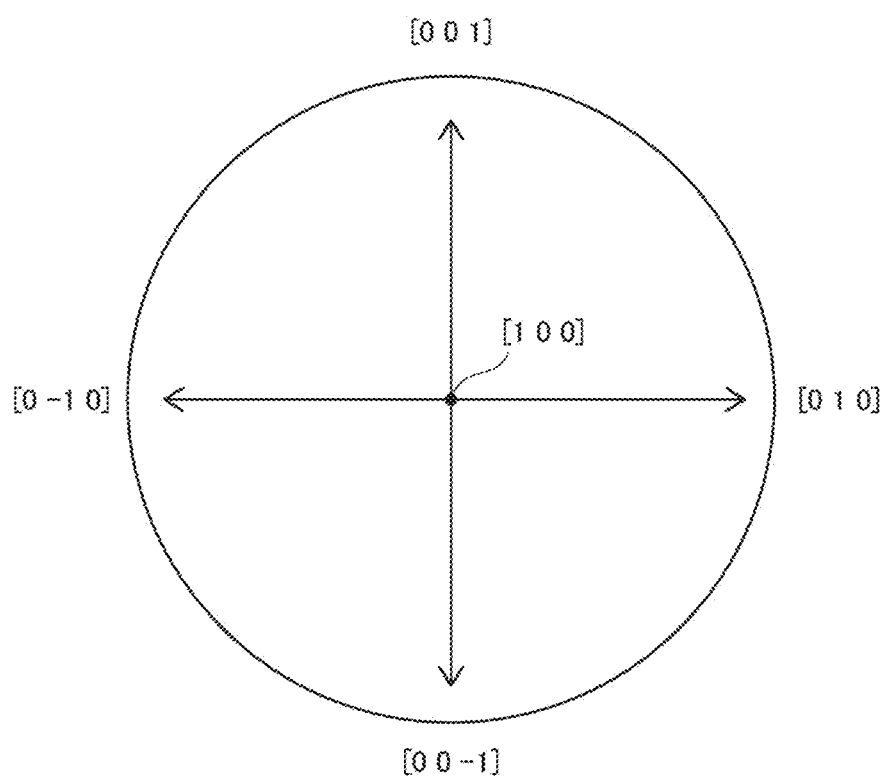
FIG. 2B is an illustration of inclination directions of a [100] axis of a silicon wafer.

The silicon wafer WF has a diameter ranging from 199.8 mm to 200.2 mm and contains phosphorus so as to have an electrical resistivity of less than 1.0 mΩ·cm. The silicon wafer WF has a main surface WF1 to which a (100) plane is inclined, and a [100] axis perpendicular to the (100) plane is inclined to an axis orthogonal to the main surface WF1 in one direction of a [001] direction, [00-1] direction, [010] direction and [0-10] direction or at an angle ranging from 0°5' to 0°25' inclined in any direction between the [001] direction, [00-1] direction, [010] direction and [0-10] direction as shown in FIG. 2B.

In the epitaxial silicon wafer EW with the above arrangement, a density of the dislocation line having the crystal orientation and entirely located inside the epitaxial film EP is equal to or less than 10 pieces per square centimeter, which shows the reduced generation of the dislocation line. Moreover, a density of SF observed on a surface of the epitaxial silicon wafer EW is equal to or less than 1 piece per square centimeter.

Manufacturing Method of Epitaxial Silicon Wafer

Next, a manufacturing method of the epitaxial silicon wafer EW will be described.

Figure 3:
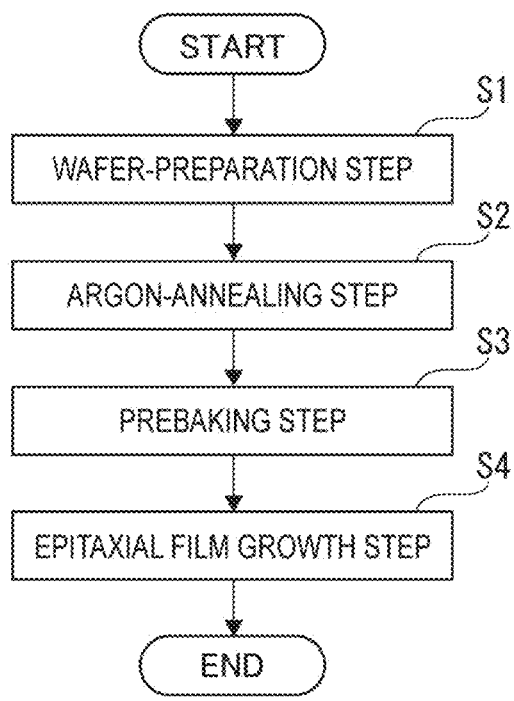
FIG. 3 is a flowchart showing a manufacturing method of the epitaxial silicon wafer according to the exemplary embodiment.

The manufacturing method of the epitaxial silicon wafer EW includes a wafer-preparation step S1, an argon-annealing step S2, a prebaking step S3, and an epitaxial film growth step S4, as shown in FIG. 3.

At the wafer-preparation step S1, the silicon wafer WF having the above arrangement is prepared. In order to obtain the silicon wafer WF, single crystal silicon containing phosphorus so as to have the electrical resistivity equal to or more than 0.5 mΩ·cm and less than 1.0 mΩ·cm and having a center axis coaxial with a [001] axis perpendicular to the (100) plane is manufactured. The single crystal silicon may be sliced not along a plane perpendicular to the center axis but along a plane inclined to the perpendicular plane. Alternatively, single crystal silicon whose center axis is inclined at an angle ranging from 0°5' to 0°25' with respect to the [100] axis perpendicular to the (100) plane may be manufactured and sliced along the plane perpendicular to the center axis.

Exemplary manufacturing conditions of the single crystal silicon are shown as follows.

Phosphorus Concentration: from $7.38 \times 10^{19}$ atoms/cm$^3$ to $1.64 \times 10^{20}$ atoms/cm$^3$ Oxygen Concentration: from $2 \times 10^{17}$ atoms/cm$^3$ to $20 \times 10^{17}$ atoms/cm$^3$ (ASTM F121-1979)

The obtained silicon wafer WF is subjected, as needed, to lapping, chemical etching, mirror surface polishing, and the like.

At the argon-annealing step S2, the silicon wafer WF is heated at a temperature from 1200 degrees C. to 1220 degrees C. under argon gas atmosphere. A heating time is preferably in a range from 30 minutes to 90 minutes. When the silicon wafer WF heated for less than 30 minutes is used for manufacturing the epitaxial silicon wafer EW, a lot of SF are generated. When the silicon wafer WF heated for more than 90 minutes is used for manufacturing the epitaxial silicon wafer EW, slip dislocation is caused.

In addition, a batch furnace capable of annealing a plurality of silicon wafers WF at one time is preferably used.

By heating the silicon wafer WF under the argon gas atmosphere, clusters generated on the silicon wafer WF are dissolved into solution to disappear, or reduced, so that the number of micropits is reducible.

At the prebaking step S3, a surface of the silicon wafer WF is etched. For instance, at the prebaking step S3, the silicon wafer WF is heated under the following conditions in an epitaxial device to be used in the epitaxial film growth step S4.

Atmosphere: hydrogen gas, hydrogen chloride gas
Flow rate of the hydrogen gas: 40 SLM
Flow rate of the hydrogen chloride gas: 1 SLM
Heating Temperature: 1190 degrees C. (from 1050 degrees C. to 1250 degrees C.)
Heating Time: 30 seconds (from 30 seconds to 300 seconds)

In order to form the atmosphere containing hydrogen gas and hydrogen chloride gas at the prebaking step S3, the temperature of the atmosphere only containing hydrogen gas is initially increased and, when the temperature of the atmosphere reaches the range from 1050 degrees C. to 1250 degrees C., it is preferable to supply the hydrogen chloride gas to the atmosphere. The supply of the hydrogen chloride gas at this timing can prevent occurrence of clouding and the slip dislocation in the epitaxial silicon wafer EW.

A removal dimension of the silicon wafer WF at the prebaking step S3 is preferably from 150 nm to 600 nm, further preferably at 500 nm±100 nm.

By thus conducting the prebaking step S3 under the gas atmosphere containing hydrogen and hydrogen chloride, an outermost layer of the silicon wafer WF as well as clusters present on the outermost layer are etched. As a result, compared with the gas atmosphere only containing hydrogen, the number of micropits present after the prebaking step S3 is reducible.

At the epitaxial film growth step S4, for instance, under the following conditions, the epitaxial film EP is grown on an etched surface of the silicon wafer WF after the prebaking step S3.

Dopant Gas: phosphine ($PH_3$) gas
Material Source Gas: trichlorosilane ($SiHCl_3$) gas
Carrier Gas: hydrogen gas
Growth Temperature: from 1100 degrees C. to 1165 degrees C.
Epitaxial Film Thickness: 2 μm (from 1 μm to 10 μm)
Resistivity (Epitaxial Film Resistivity): 0.2 Ω·cm (from 0.01 Ω·cm to 10 Ω·cm)

With a large inclination angle of a crystal axis of the silicon wafer, a dislocation line is likely to be generated at the epitaxial film growth step, and, at a high growth temperature, the dislocation is detectable as SF including a plane dislocation as well as the dislocation line on the surface of the epitaxial film. However, at a low growth temperature, it is considered that the dislocation line does not go through the surface of the epitaxial film but an end of the dislocation line lies inside the epitaxial film.

With a small inclination angle of the crystal axis of the silicon wafer, the number of Step on a dislocation surface (i.e., a slip plane (111)) appearing on the (100) plane is reduced to hardly generate a dislocation line on the silicon wafer. When an epitaxial film is grown on the silicon wafer at a low temperature of less than 1100 degrees C., due a wide Terrace and a small energy of silicon, the supplied silicon cannot reach Kink position but abnormally grows with silicon staying on the Terrace and acting as a nucleus to easily generate hillock defects.

Accordingly, by performing the epitaxial film growth at the temperature of 1100 degrees C. or more on the silicon wafer where the inclination angle of the crystal axis is small and the dislocation line is unlikely to be generated, an epitaxial wafer having no hillock defect existing on the surface of the epitaxial film and no dislocation line generated inside the epitaxial film can be obtained. Consequently, the epitaxial silicon wafer EW, in which a density of the dislocation line having the crystal orientation and entirely located inside the epitaxial film EP is equal to or less than 10 pieces per square centimeter to show the reduced generation of the dislocation line, can be obtained. The temperature for the epitaxial film growth, exceeding 1165 degrees C., is not preferable since slip dislocation is generated.

Example(s)

Next, the invention will be described in more detail with reference to Examples and Comparatives. However, the invention is by no means limited thereto.

Manufacturing Method of Epitaxial Silicon Wafer

Comparative 1

Figure 4:
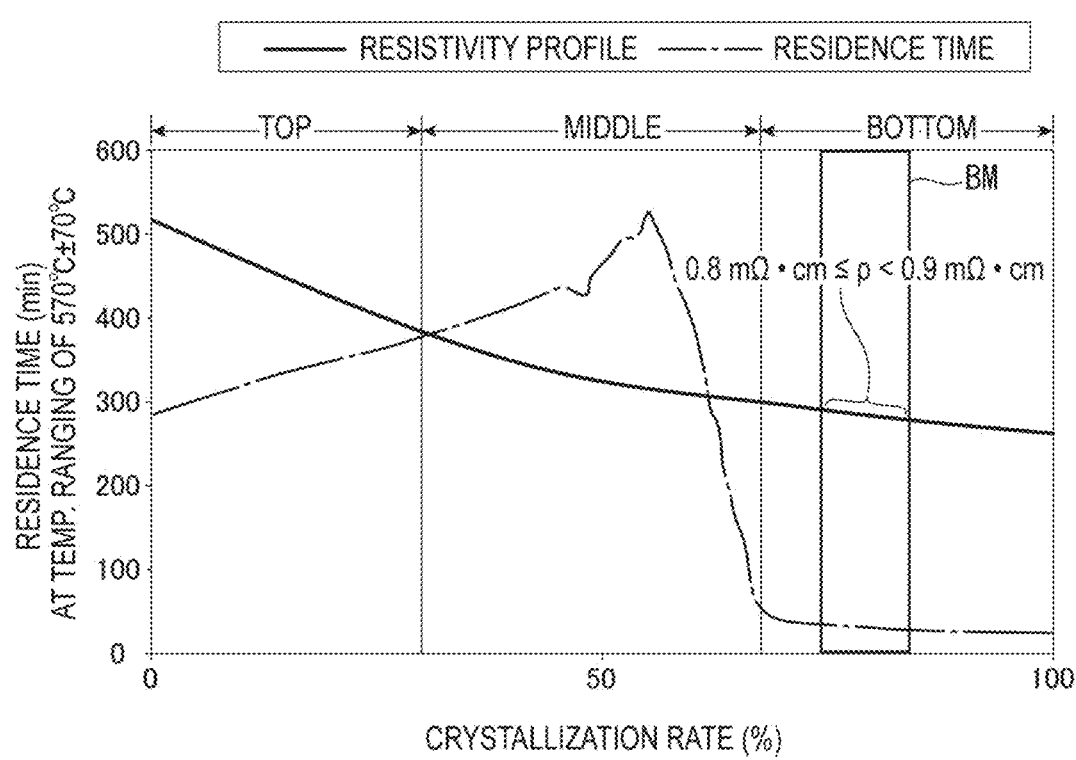
FIG. 4 illustrates a relationship between a residence time at a temperature ranging of 570 degrees C.±70 degrees C. and a resistivity at a crystallization rate of single crystal silicon, and a position of a part of the single crystal silicon from which a silicon wafer is acquired, in each of Comparative 1 and Example 1 of Examples of the invention.

Firstly, in accordance with Czochralski method, a 200-mm diameter single crystal silicon having a center axis in line with a [100] axis, in which phosphorus was added so that a resistivity of a straight body was less than 1.0 mΩ·cm, was manufactured. A residence time of the single crystal silicon at the temperature ranging of 570 degrees C.±70 degrees C. at each of crystallization rates, as shown in FIG. 4, was substantially linearly increased from about 280 minutes to about 530 minutes in the residence time of a region of the single crystal silicon, the region having up to about 56% of the crystallization rate. The residence time was substantially linearly decreased from about 530 minutes from about 40 minutes in a subsequent region up to about 68%, and was substantially linearly decreased from about 40 minutes to about 30 minutes in the residence time in a further subsequent region. Moreover, the resistivity for each of the crystallization rates was lowered toward a bottom end as shown in FIG. 4.

It should be noted that the crystallization rate refers to a rate of a pull-up weight of the single crystal silicon relative to the initial charge weight of a melt liquid initially put in a crucible.

The single crystal silicon was sliced, not along a perpendicular plane to the center axis of the single crystal silicon, but along an inclined plane to the perpendicular plane. Accordingly, a silicon wafer was manufactured to have a main surface to which a (100) plane was inclined; and a [100] axis that was perpendicular to the (100) plane being inclined only at an angle of 0°43' in a [010] direction with respect to an axis orthogonal to the main surface.

With an upper side of the single crystal silicon in a pull-up direction defined as a top region, a lower side thereof defined as a bottom region, and a region between the top region and the bottom region defined as a middle region, the silicon wafer of Comparative 1 was obtained from a middle point BM of the bottom region. The residence time of the middle point BM of the single crystal silicon at the temperature at the temperature ranging of 570 degrees C.±70 degrees C. was 40 minutes or less. A substrate resistivity of the silicon wafer of Comparative 1 was equal to or more than 0.8 mΩ·cm and less than 0.9 mΩ·cm.

Next, the silicon wafer was subjected to the argon-annealing step. In this step, the silicon wafer was heated at the temperature of 1200 degrees C. for 30 minutes under argon gas atmosphere.

Subsequently, the silicon wafer was subjected to the prebaking step. In this step, the silicon wafer was heated at the temperature of 1190 degrees C. for 30 seconds under gas atmosphere containing hydrogen and hydrogen chloride. A removal dimension of the silicon wafer was 160 nm.

Next, the epitaxial film growth step was performed on an etched surface of the silicon wafer under the following conditions to obtain a sample of Comparative 1.
Dopant Gas: phosphine ($PH_3$) gas
Material Source Gas: trichlorosilane ($SiHCl_3$) gas
Carrier Gas: hydrogen gas
Growth Temperature: 1040 degrees C.
Epitaxial Film Thickness: 2 μm
Resistivity of Epitaxial Film: 0.2 Ω·cm Comparative 2

Figure 5:
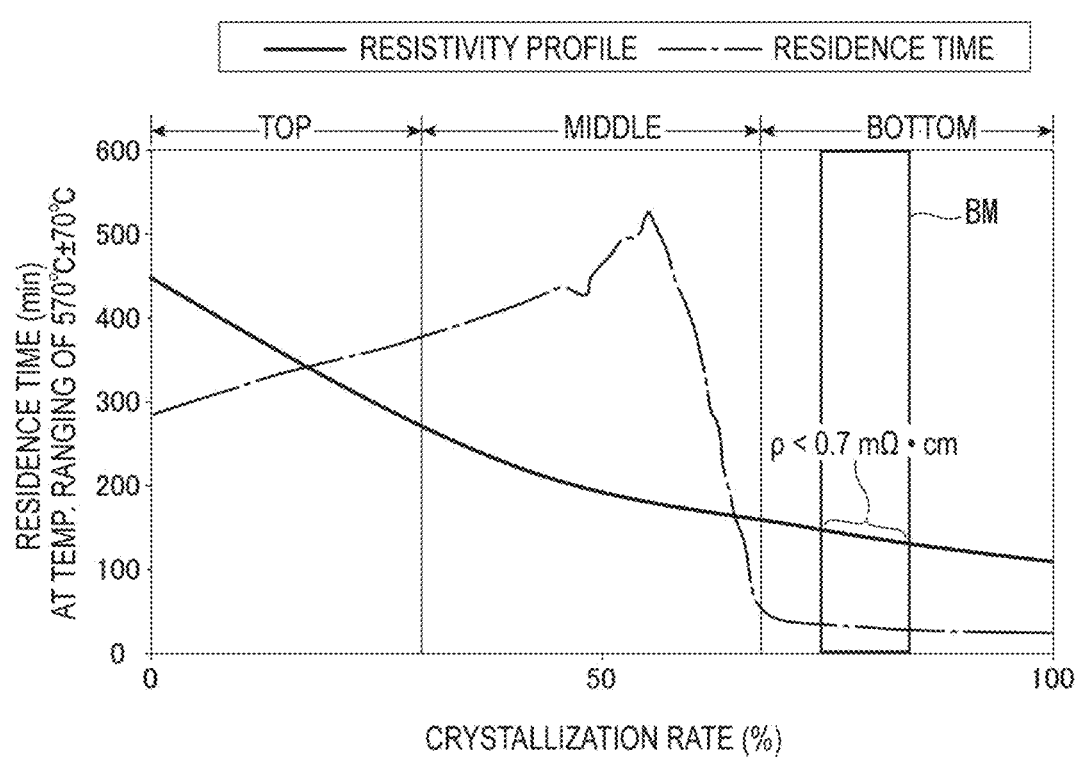
FIG. 5 illustrates a relationship between a residence time at the temperature ranging of 570 degrees C.±70 degrees C. and a resistivity at a crystallization rate of single crystal silicon, and a position of a part of the single crystal silicon from which a silicon wafer is acquired, in each of Comparative 2 and Example 2 of the Examples.

As shown in FIG. 5, single crystal silicon was manufactured under the same conditions as those in Comparative 1 except that an amount of phosphorus was adjusted so that the resistivity at each crystallization rate was lower than that in Comparative 1. Consequently, a silicon wafer having the same plane orientation as that in Comparative 1 was obtained from the same middle point BM of the bottom region of the single crystal silicon as that in Comparative 1. A substrate resistivity of the silicon wafer of Comparative 2 was less than 0.7 mΩ·cm.

Subsequently, the argon-annealing step, the prebaking step, and the epitaxial film growth step were conducted under the same conditions as those in Comparative 1, so that a sample of Comparative 2 was obtained.

Comparative 3

Figure 6:
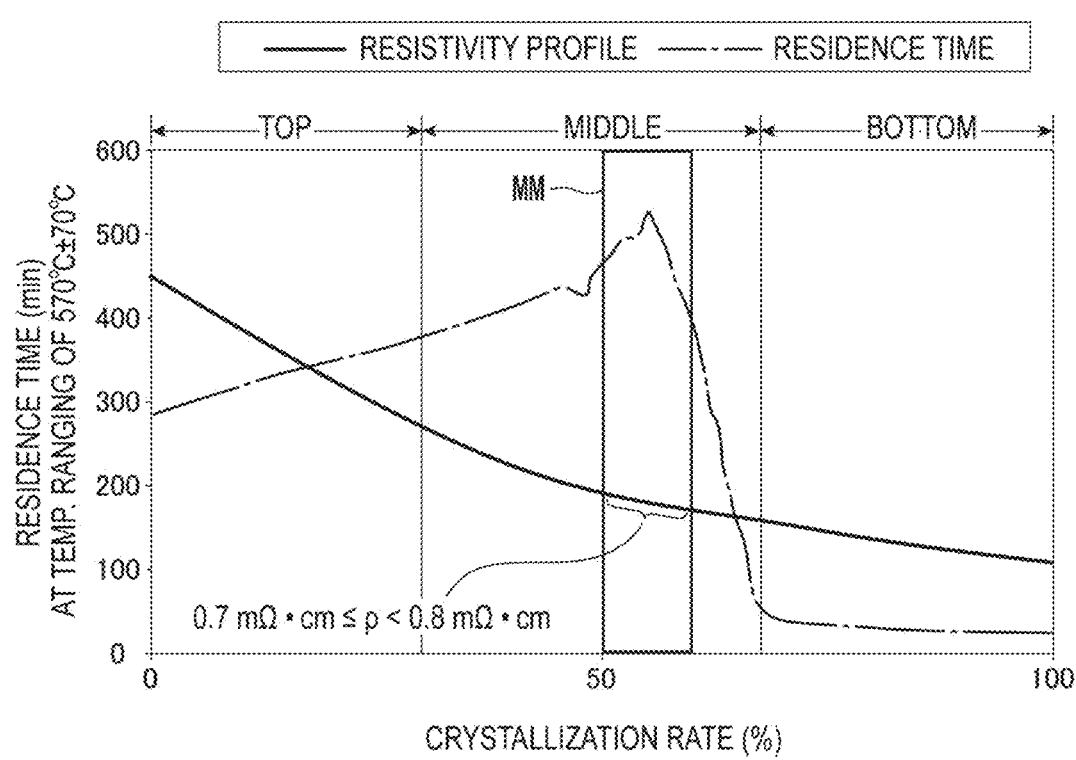
FIG. 6 illustrates a relationship between a residence time at the temperature ranging of 570 degrees C.±70 degrees C. and a resistivity at a crystallization rate of single crystal silicon, and a position of a part of the single crystal silicon from which a silicon wafer is acquired, in each of Comparative 3 and Example 3 of the Examples.

As shown in FIG. 6, a silicon wafer having the same plane orientation as that in Comparative 1 was obtained from the same middle point MM of the middle region in the single crystal silicon manufactured in Comparative 2. The residence time of the middle point BM of the single crystal silicon at the temperature ranging of 570 degrees C.±70 degrees C. was 390 minutes or more. A substrate resistivity of the silicon wafer of Comparative 3 was equal to or more than 0.7 mΩ·cm and less than 0.8 mΩ·cm.

Subsequently, the argon-annealing step, the prebaking step, and the epitaxial film growth step were conducted under the same conditions as those in Comparative 1, so that a sample of Comparative 3 was obtained.

Comparatives 4 to 7

Single crystal silicon of each of Comparatives 4 to 7 was manufactured under the same conditions as those in Comparative 2 as shown in FIG. 5. The single crystal silicon was sliced, along a plane that is not orthogonal to the center axis of the single crystal silicon, from the same middle point MM as in Comparative 3. Thus, a silicon wafer of each of Comparatives 4 and 6 was obtained to have a main surface to which a (100) plane was inclined; and a [100] axis that was perpendicular to the (100) plane being inclined only at an angle of 0°30' in a [010] direction with respect to an axis orthogonal to the main surface. A silicon wafer of each of Comparatives 5 and 7 was obtained from the above middle point MM, the silicon wafer including: the main surface to which the (100) plane is inclined; and the [100] axis that is perpendicular to the (100) plane and inclined at an angle of 0°45' in the [010] direction with respect to the axis orthogonal to the main surface. A substrate resistivity of the silicon wafer of each of Comparatives 4 to 7 was equal to or more than 0.7 mΩ·cm and less than 0.8 mΩ·cm.

Subsequently, the silicon wafers of Comparatives 4 and 5 were subjected to the argon-annealing step, the prebaking step, and the epitaxial film growth step under the same conditions as those in Comparative 1 except that the growth temperature in the epitaxial film growth step was changed to 1100 degrees C., so that samples of Comparatives 4 and 5 were obtained. Moreover, the silicon wafers of Comparatives 6 and 7 were subjected to the argon-annealing step, the prebaking step, and the epitaxial film growth step under the same conditions as those in Comparative 4 except that the silicon wafers were heated at the temperature of 1220 degrees C. for 60 minutes in the argon-annealing step and the processing time in the prebaking step was changed to 90 seconds, so that samples of Comparatives 6 and 7 were obtained.

Example 1

Single crystal silicon was manufactured under the same conditions as those in Comparative 1 as shown in FIG. 4. The single crystal silicon was sliced from the middle point BM of the bottom region along a plane not orthogonal to the center axis. Thus, a silicon wafer was obtained to have a main surface to which a (100) plane was inclined; and a [100] axis that was perpendicular to the (100) plane being inclined only at an angle of 0°15' in a [010] direction with respect to an axis orthogonal to the main surface as shown in Table 1. A substrate resistivity of the silicon wafer of Example 1 was equal to or more than 0.8 mΩ·cm and less than 0.9 mΩ·cm.

Next, the silicon wafer was subjected to the argon-annealing step under the same conditions as those in Comparative 1 except that the temperature was changed to 1220 degrees C. and the time was changed to 60 minutes.

Subsequently, the silicon wafer was subjected to the prebaking step under the same conditions as those in Comparative 1 except that the temperature was changed to 1190 degrees C., the time was changed to 90 seconds and the removal dimension was changed to 500 nm.

Subsequently, the etched surface of the silicon wafer was subjected to the epitaxial film growth step under the same conditions as those in Comparative 1 except that the growth temperature was changed to 1100 degrees C., so that a sample of Example 1 was obtained.

Examples 2 and 3

Single crystal silicon of each of Examples 2 and 3 was manufactured under the same conditions as those in Comparative 2 as shown in FIG. 5. Silicon wafers of Examples 2 and 3 having the same plane orientation as that in Example 1 were respectively obtained from the same middle points BM and MM as those of Comparatives 2 and 3 in the single crystal silicon. A substrate resistivity of the silicon wafer of Example 2 was less than 0.7 mΩ·cm. A substrate resistivity of the silicon wafer of Example 3 was equal to or more than 0.7 mΩ·cm and less than 0.8 mΩ·cm.

Subsequently, the argon-annealing step, the prebaking step, and the epitaxial film growth step were conducted under the same conditions as those in Example 1, so that samples of Examples 2 and 3 were obtained.

Examples 4 to 8

Single crystal silicon of each of Examples 4 to 8 was manufactured under the same conditions as those in Comparative 2 as shown in FIG. 5. The single crystal silicon was sliced, not along a perpendicular plane to the center axis of the single crystal silicon, but along an inclined plane to the perpendicular plane from the same middle point MM as that in Comparative 3. Thus, a silicon wafer of each of Examples 4 and 7 was obtained to have a main surface to which a (100) plane was inclined; and a [100] axis that was perpendicular to the (100) plane being inclined only at an angle of 0°5' in a [010] direction with respect to an axis orthogonal to the main surface. A silicon wafer of Example 5 was obtained from the above middle point MM, the silicon wafer including: the main surface to which the (100) plane is inclined; and the [100] axis that is perpendicular to the (100) plane and inclined at an angle of 0°15' in the [010] direction with respect to the axis orthogonal to the main surface. A silicon wafer of each of Examples 6 and 8 was obtained from the above middle point MM, the silicon wafer including: the main surface to which the (100) plane is inclined; and the [100] axis that is perpendicular to the (100) plane and inclined at an angle of 0°25' in the [010] direction with respect to the axis orthogonal to the main surface. A substrate resistivity of the silicon wafer of each of Examples 4 to 8 was equal to or more than 0.7 mΩ·cm and less than 0.8 mΩ·cm.

Subsequently, the silicon wafers of Examples 4 to 6 were subjected to the argon-annealing step, the prebaking step, and the epitaxial film growth step under the same conditions as those in Comparative 4, so that samples of Examples 4 to 6 were obtained. The silicon wafers of Examples 7 and 8 were subjected to the argon-annealing step, the prebaking step, and the epitaxial film growth step under the same conditions as those in Comparative 6, so that samples of Examples 7 and 8 were obtained.

Evaluation
Evaluation of Surface of Epitaxial Silicon Wafer

LPD having a size of 90 nm or more, which were observed on the surface of the epitaxial film of each of Comparatives 1 to 3 and Examples 1 to 3, were counted using a surface inspector (SP-1 in DCN mode, manufactured by KLA-Tencor Corporation) and the number of pieces per unit area (i.e., density) was evaluated. Results are shown in Table 1.

In comparison between Comparatives 1 to 3 and Examples 1 to 8, there was no significant difference in terms of the density of LPD. However, in comparison between Comparatives 1 to 3 and Comparatives 4 to 7, the densities of LPD in Comparatives 4 to 7 were higher than those in Comparatives 1 to 3.

This demonstrated that, when the inclination angle of the [100] axis of the silicon wafer exceeded 0°25', the density of LPD increased at the growth temperature of 1100 degrees C. or more and decreased at the growth temperature of less than 1100 degrees C. in the epitaxial film growth step.

Moreover, this demonstrated that, when the inclination angle of the [100] axis of the silicon wafer was in a range from 0°5' to 0°25', the density of LPD decreased even at the growth temperature of 1100 degrees C. or more in the epitaxial film growth step.

Evaluation of Inside of Epitaxial Silicon Wafer

The 2-μm thick epitaxial films of Comparatives 1 to 7 and Examples 1 to 8 were subjected to selective etching of 1 μm using the above-described M-Dash liquid. Subsequently, the etched surface was observed with an optical microscope (NIKON, OPTIPHOT88) and defects having a size of 1.4 μm or more were counted among a plurality of linear defects extending from the center of the epitaxial silicon wafer toward an outer edge thereof. The number (density) of the defect pieces per unit area is shown in FIG. 7.

Figure 7:
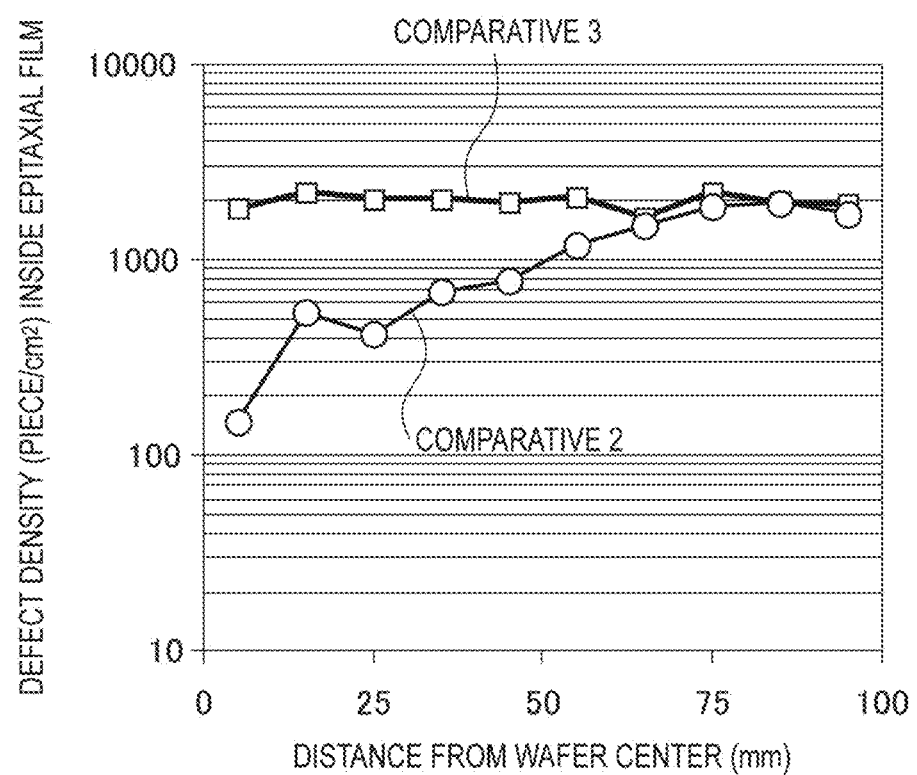
FIG. 7 is a graph showing a distance from the center of the epitaxial silicon wafer and a density of defects inside the epitaxial film in the Examples.

As shown in FIG. 7, no defect was detected in Comparatives 1, 4 to 7 and Examples 1 to 8. However, defects were detected in Comparatives 2 and 3. In Comparative 3, defects equal to or more than 1600 pieces per square centimeter were detected in the entire observation region. In Comparative 2, although defects of 148 pieces per square centimeter were detected at the center of the epitaxial silicon wafer, the number of the defects was gradually increased toward the outer edge and reached substantially the same level as in Comparative 3 at the outer edge.

Figure 1A:
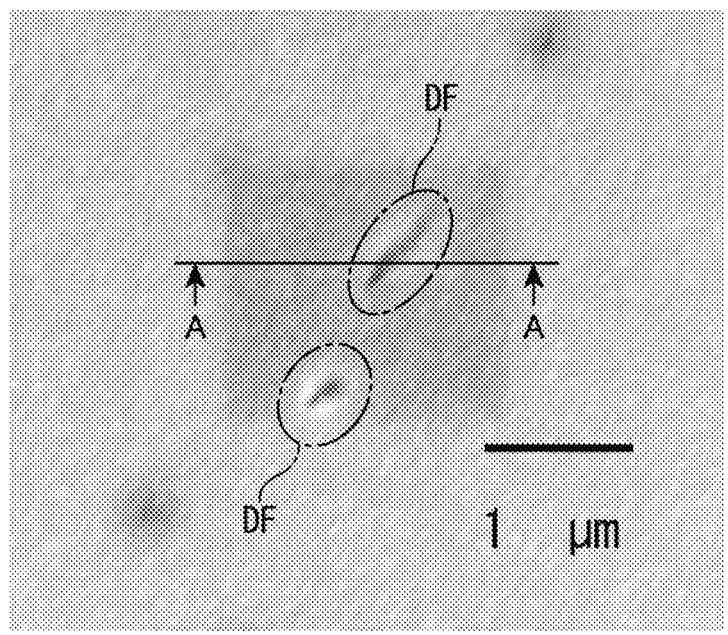
FIG. 1A is a photograph of a dislocation line in a plan view.
Figure 1B:
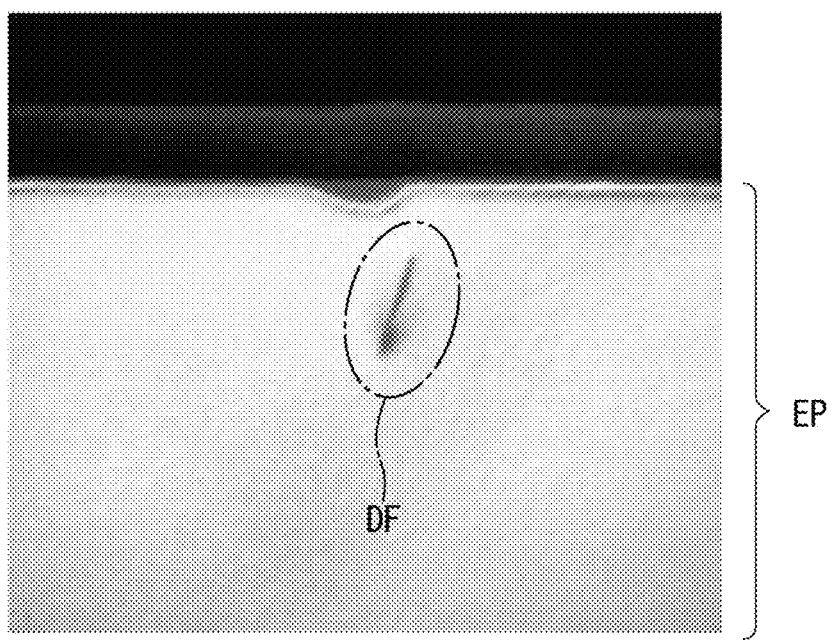
FIG. 1B is a photograph of the dislocation line in a vertically cross-sectional view along an A-A line of FIG. 1A.

The defects detected in Comparatives 2 and 3 were observed using the TEM and found to be dislocation defects DF having a main surface to which the (100) plane is inclined and having a crystal orientation in any direction of the [011] direction, [0-1-1] direction, [0-11] direction and [01-1] direction as shown in FIGS. 1A and 1B. It was found from the foregoing that the dislocation line having the

TABLE 1

| | position for acquring wafers | substrate resistivity ρ (mΩ · cm) | inclination angle | argon-annealing conditions | | epitaxial growth conditions | | |
|---|---|---|---|---|---|---|---|---|
| | | | | temp. (° C.) | time (min.) | prebaking time (sec.) | growth temp. (° C.) | LPD density (pieces/cm²) |
| Comp. 1 | bottom | 0.8 ≤ ρ < 0.9 | 0°43' | 1200 | 30 | 30 | 1040 | 1 or less |
| Comp. 2 | bottom | ρ < 0.7 | | | | | | 1 or less |
| Comp. 3 | middle | 0.7 ≤ ρ < 0.8 | | | | | | 1 or less |
| Comp. 4 | middle | 0.7 ≤ ρ < 0.8 | 0°30' | | | | 1100 | 8 or more |
| Comp. 5 | middle | 0.7 ≤ ρ < 0.8 | 0°45' | | | | | 8 or more |
| Comp. 6 | middle | 0.7 ≤ ρ < 0.8 | 0°30' | 1220 | 60 | 90 | | 8 or more |
| Comp. 7 | middle | 0.7 ≤ ρ < 0.8 | 0°45' | | | | | 8 or more |
| Ex. 1 | bottom | 0.8 ≤ ρ < 0.9 | 0°15' | | | | | 1 or less |
| Ex. 2 | bottom | ρ < 0.7 | | | | | | 1 or less |
| Ex. 3 | middle | 0.7 ≤ ρ < 0.8 | | | | | | 1 or less |
| Ex. 4 | middle | 0.7 ≤ ρ < 0.8 | 0°5' | 1200 | 30 | 30 | | 1 or less |
| Ex. 5 | middle | 0.7 ≤ ρ < 0.8 | 0°15' | | | | | 1 or less |
| Ex. 6 | middle | 0.7 ≤ ρ < 0.8 | 0°25' | | | | | 1 or less |
| Ex. 7 | middle | 0.7 ≤ ρ < 0.8 | 0°5' | 1220 | 60 | 90 | | 1 or less |
| Ex. 8 | middle | 0.7 ≤ ρ < 0.8 | 0°25' | | | | | 1 or less | crystal orientation and entirely located inside the epitaxial film was present in the epitaxial film of each of Comparatives 2 and 3.

In comparison between Comparative 1 and Example 1, although the used silicon wafers were obtained from the region having the same residence time at a temperature ranging of 570 degrees C.±70 degrees C. in respective pieces of single crystal silicon, the dislocation line was generated in the silicon wafer of Comparative 2, which had a low substrate resistivity, whereas no dislocation line was generated in the silicon wafer of Comparative 1, which had a high substrate resistivity.

It has been found from the foregoing that the substrate resistivity of the silicon wafer influences on the generation of the dislocation line inside the epitaxial film.

Further, in comparison between Comparatives 2 and 3, although the used silicon wafers were obtained from the same single crystal silicon, more dislocation lines were generated in the silicon wafer of Comparative 3, whose residence time at the temperature ranging of 570 degrees C.±70 degrees C. was longer.

It has been found from the foregoing that the residence time at the temperature ranging of 570 degrees C.±70 degrees C. of the single crystal silicon influences on the generation of the dislocation line inside the epitaxial film.

Moreover, although the substrate resistivity in Comparative 3 was higher than that in Comparative 2, more dislocation lines were generated in Comparative 3 than in Comparative 2.

It has been found from the foregoing that the residence time at the temperature ranging of 570 degrees C.±70 degrees C. of the single crystal silicon exerts more influence on the generation of the dislocation line inside the epitaxial film than the substrate resistivity influences on the generation of the dislocation line inside the epitaxial film.

Moreover, although the residence time at the temperature ranging of 570 degrees C.±70 degrees C. and the substrate resistivity in Comparatives 4 to 7 were the same as those in Comparative 3, no dislocation line was generated in Comparatives 4 to 7.

It has been found from the foregoing that the growth temperature at the epitaxial film growth step significantly influences on the generation of the dislocation line inside the epitaxial film.

In Examples 1, 2 and 3 to 8, no dislocation line was generated although the residence time at the temperature ranging of 570 degrees C.±70 degrees C. and the substrate resistivity were the same as those in Comparatives 1 to 3.

It has been found from the foregoing that the generation of the dislocation line can be reduced by setting the inclination angle of the [100] axis to a predetermined value, in other words, by setting the plane orientation of the silicon wafer in a predetermined direction.

It is also presumable that the same results as those in Examples 1 to 8 are obtained even when the inclination angle of the [100] axis relative to the axis orthogonal to the main surface is changed to the opposite direction (i.e., the [0-10] direction) from those in Examples 1 to 8 or the orthogonal direction (i.e., the [001] or [00-1] direction) to those in Examples 1 to 8, or in any direction between the opposite and orthogonal directions. This is because that the number of the Step on the (111) plane (dislocation surface) appearing on the (100) plane does not depend on the inclination direction of the crystal axis.

Further, it is also presumable that the same results as those in Examples 1 to 8 are obtained even when the inclination angle of the [100] axis is any angle in a range from 0°5' to 0°25'. Since it depends on the temperature during the epitaxial film growth whether nucleus formation starts on Terrace, it is presumable that, as long as the inclination angle of the [100] axis falls within the range from 0°5' to 0°25', generation of hillock defects caused by abnormal growth of silicon staying on Terrace and acting as a nucleus can be reduced by appropriately selecting the growth temperature at 1100 degrees C. or more.

The invention claimed is:

1. A manufacturing method of an epitaxial silicon wafer, the epitaxial silicon wafer comprising: a silicon wafer doped with phosphorus as a dopant and having a resistivity of less than 1.0 mΩ·cm; and an epitaxial film formed on the silicon wafer, the manufacturing method comprising:
preparing the silicon wafer comprising a main surface to which a (100) plane is inclined and a [100] axis that is perpendicular to the (100) plane and inclined at an angle ranging from 0°5' to 0°25' with respect to an axis orthogonal to the main surface;
annealing the silicon wafer at a temperature from 1200 degrees C. to 1220 degrees C. for 30 minutes or more under argon gas atmosphere;
prebaking to etch a surface of the silicon wafer after the annealing; and
growing the epitaxial film at a growth temperature ranging from 1100 degrees C. to 1165 degrees C. on the surface of the silicon wafer after the prebaking.

2. The manufacturing method of the epitaxial silicon wafer according to claim 1, wherein
the surface of the silicon wafer is etched at a removal dimension ranging from 150 nm to 600 nm in the prebaking.

3. An epitaxial silicon wafer comprising: a silicon wafer doped with phosphorus as a dopant and having a resistivity of less than 1.0 mΩ·cm; and an epitaxial film formed on the silicon wafer,
the silicon wafer comprising a main surface to which a (100) plane is inclined and a [100] axis that is perpendicular to the (100) plane and inclined at an angle ranging from 0°5' to 0°25' with respect to an axis orthogonal to the main surface,
wherein a density of a dislocation line having a crystal orientation and entirely located inside the epitaxial film is equal to or less than 10 pieces per square centimeter.

* * * * *